United States Patent [19]

Müller

[11] Patent Number: 4,839,256

[45] Date of Patent: Jun. 13, 1989

[54] PERFLUOROALKYL GROUP-CONTAINING 1,2-NAPTHOQUINONE DAIZIDE COMPOUNDS AND REPRODUCTION MATERIALS PRODUCED THEREFROM

[75] Inventor: Werner H. Müller, E. Greenwich, R.I.

[73] Assignee: Hoechst Aktiengesellschaft, Fed. Rep. of Germany

[21] Appl. No.: 88,980

[22] Filed: Aug. 21, 1987

Related U.S. Application Data

[63] Continuation of Ser. No. 742,418, Jun. 7, 1985, abandoned.

[30] Foreign Application Priority Data

Jun. 8, 1984 [DE] Fed. Rep. of Germany ....... 3421471

[51] Int. Cl.$^4$ .......................................... G03C 1/54
[52] U.S. Cl. ................................. 430/192; 430/165; 430/166; 430/193; 430/303; 534/557
[58] Field of Search ............... 430/193, 192, 303; 534/556, 557

[56] References Cited

U.S. PATENT DOCUMENTS

| | | | |
|---|---|---|---|
| 3,106,465 | 10/1963 | Neugebauer et al. | 430/302 |
| 3,148,983 | 9/1964 | Endermann et al. | 430/192 |
| 3,511,178 | 5/1970 | Curtin | 101/450 |
| 3,677,178 | 7/1972 | Gipe | 101/450 |
| 3,682,633 | 8/1972 | Curtin | 96/27 |
| 3,711,285 | 1/1973 | Deutsch et al. | 430/193 |
| 3,910,187 | 10/1975 | Cords | 430/303 |
| 4,024,122 | 5/1977 | Ross et al. | 260/141 |
| 4,275,139 | 6/1981 | Stahlhofer | 430/192 |
| 4,358,522 | 11/1982 | Fujita et al. | 430/166 |
| 4,504,567 | 3/1985 | Yamamoto et al. | 430/165 |

FOREIGN PATENT DOCUMENTS

| | | | |
|---|---|---|---|
| 1075066 | 4/1980 | Canada | 430/191 |
| 0037094 | 10/1981 | European Pat. Off. | |
| 332413 | 3/1972 | U.S.S.R. | 430/191 |
| 1501128 | 2/1978 | United Kingdom | |

Primary Examiner—Charles L. Bowers, Jr.
Attorney, Agent, or Firm—Foley & Lardner Schwartz, Jeffery, Schwaab, Mack Blumenthal & Evans

[57] ABSTRACT

Light-sensitive perfluoroalkyl group-containing 1,2-naphthoquinone diazide compounds and reproduction materials comprising a support and a light-sensitive layer containing such compounds useful in producing planographic printing plates for waterless printing. The 1,2-naphthoquinone diazide compounds correspond to the formula I.

$$(R_FW)_p-Ar(-OD)_n \qquad \text{(I)} $$
$$\overset{R^1}{|}$$

wherein
Ar denotes a mononuclear to trinuclear aromatic radical
D is a 1,2-naphthoquinone-2-diazide-4-sulfonyl radical or a 1,2-naphthoquinone-2-diazide-5-sulfonyl radical,
$R_F$ is a perfluoroalkyl radical having from 5 to 15 carbon atoms,
W is a single bond or is selected from the group consisting of $$-(CH_2)_mCOO-$$
$$-(CH_2)_mOOC-CHR^2-O-$$
$$-(CH_2)_mO-C_oH_{2o}-COO-$$
$$-(CH_2)_mOOC-$$
$$-(CH_2)_mOOC-C_oH_{2o}-COO-$$
$$-(CH_2)_mSO_2NH-$$
$$-(CH_2)_mOOC-CH=CH-COO-$$
$$-C_6H_4SO_2NH-$$
$$-(CH_2)_mCO-$$
$$-(CH_2)_mCONH-$$
$$-(CH_2)_mSO_3-$$
$$-(CH_2)_mOOC-C_oH_{2o}-CONH-$$
$$-C_6H_4SO_3-$$
$$-(CH_2)_mOOC-CH=CH-CONH,$$

$R^1$ is hydrogen, halogen, an alkyl or alkoxy group having from 1 to 5 carbon atoms, an acetyl or a propionyl,
$R^2$ is an alkyl group having from 1 to 12 carbon atoms,
m is 0 or a number from 1 to 6,
n is a number from 1 to 3,
o is a number from 1 to 12, and
p is a number from 1 to 3.

6 Claims, No Drawings

PERFLUOROALKYL GROUP-CONTAINING 1,2-NAPTHOQUINONE DAIZIDE COMPOUNDS AND REPRODUCTION MATERIALS PRODUCED THEREFROM

This application is a continuation of application Ser. No. 742,418, filed June 7, 1985, now abandoned.

BACKGROUND OF THE INVENTION

The present invention relates to light-sensitive, perfluoroalkyl-group containing 1,2-naphthoquinone diazide compounds and to light-sensitive reproduction materials which comprise these compounds and are suitable for use in the production of printing plates for waterless offset printing.

Other than in the customarily used offset-printing process, where differentiation between image areas and non-image areas during printing is effected by the simultaneous action of water or water-containing liquids, on the one hand, and printing ink, on the other hand, differentiation in waterless planographic printing, particularly offset printing, normally results from the fact that the ink-receptive areas and the ink-repellent areas (which are not moist with water) on a printing plate surface show different interactions with the printing ink. From the state of the art, the following publications are known, which deal with this subject:

U.S. Pat. No. 3,677,178 discloses a printing plate in which a support material comprising a metal, a plastic, or paper is coated with a layer of a hydrophobic and oleophobic silicone rubber and a radiation-sensitive reproduction layer, in the indicated or in the reverse order. As the radiation-sensitive compound, the reproduction layer contains ammonium dichromate, formaldehyde condensates of diphenylamine-4-diazonium salts, or polyvinyl cinnamate. In the printing process, the ink-receptive areas either comprise bared portions of the support material or portions of the reproduction layer which have been cured by irradiation.

In the printing plate according to U.S. Pat. No. 3,511,178 and U.S. Pat. No. 3,682,633, the support material is first coated with a radiation-sensitive reproduction layer and then with a coating having a lower release value (reduced adhesive interaction) with respect to printing inks than the support material. The last-mentioned coating either comprises of polysiloxane (silicone elastomer) or a fluorine-containing organic compound, for example, a homopolymer of the methacrylic acid ester of perfluorooctanol.

Further embodiments of printing plates for waterless offset-printing and of compounds which are suitable for use in printing plates of this kind are, for example, disclosed in the following publications:

In German Offenlegungsschrift No. 25 24 562 (equivalent to British Pat. No. 1,501,128) radiation-sensitive coatings are described, which comprise an aromatic diazonium cation, an anion of a carboxylic acid or sulfonic acid containing perfluoroalkyl groups and, optionally, a polymeric organic binder. It is stated that these layers can be used for printing directly after irradiation, i.e., a developing step is not required.

Published European Patent Application No. 0,037,094, discloses that it is possible to prepare radiation-sensitive polymers which contain copolymers of (a) acrylic or methacrylic acid perfluoroalkyl esters and (b) acrylic or methacrylic acid azidobenzoyloxy-alkyl esters for use as a coating for printing plates, among other uses. In addition to these copolymers, radiation-sensitive reproduction layers can also contain organic binders which are developable in aqueous-alkaline solutions and customary additives. After irradiation and development, a relief image is produced on the support material.

The ink-repellent areas of virtually all of these prior are planographic printing plates either contain polysiloxanes or highly fluorinated organic compounds. Although the polysiloxanes show an excellent ink repellency, plates comprising substances of that kind have the disadvantage that the equipment and materials used for processing these plates are permanently soiled and thus have little utility for other purposes.

It is also a disadvantage of the hitherto available offset plates for waterless printing that, apart from a few exceptions, they operate with light-curable layers or compounds, i.e., they yield positive prints. Reversal is obtained by the fact that, as a rule, the exposed areas with the superposed ink-repellent layer remain on the support after development and printing is effected from the bared support or an ink-receptive sublayer.

One of the few negative-working plates for waterless offset printing known in the art is described in German Offenlegungsschrift No. 29 43 379. This plate comprises a support and a light-sensitive layer containing a 1,2-quinone diazide sulfonic acid ester of a phenol resin, with not more than 20% of the layer being soluble in ethanol. A silicone rubber layer is present on top of the light-sensitive layer. The plate must be developed with ethanol, since the ink-repellent cover layer is not wetted by aqueous developer solutions.

SUMMARY OF THE INVENTION

It is accordingly an object of the present invention to provide a presensitized printing plate suitable for processing with aqueous solutions.

It is another object of the invention to provide a printing plate, as above, which is suitable for forming a planographic printing plate which prints a negative image of the original, without being moistened with water.

Still another object of the invention is to provide novel light-sensitive compounds which are suitable for use in the presensitized printing plate.

These objects are achieved, according to the invention, by providing a perfluoroalkyl group-containing 1,2-naphthoquinone-2-diazide sulfonic acid ester corresponding to the general formula I

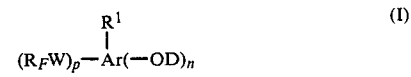

wherein
Ar denotes a mononuclear to trinuclear aromatic radical
D is a 1,2-naphthoquinone-2-diazide-4-sulfonyl radical or a 1,2-naphthoquinone-2-diazide-5-sulfonyl radical,
$R_F$ is a perfluoroalkyl radical having from 5 to 15 carbon atoms,
W is a single bond or is selected from the group consisting of

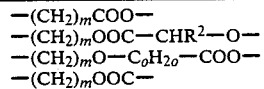

-continued

```
—(CH₂)ₘOOC—CₒH₂ₒ—COO—
—(CH₂)ₘSO₂NH—
—(CH₂)ₘOOC—CH=CH—COO—
—C₆H₄SO₂NH—
—(CH₂)ₘCO—
—(CH₂)ₘCONH—
—(CH₂)ₘSO₃—
—(CH₂)ₘOOC—CₒH₂ₒ—CONH—
—C₆H₄SO₃—
—(CH₂)ₘOOC—CH=CH—CONH,
```

$R^1$ is selected from the group consisting of hydrogen, halogen, an alkyl or alkoxy group having from 1 to 5 carbon atoms, acetyl and propionyl,
$R^2$ is an alkyl group having from 1 to 12 carbon atoms,
m is 0 or a number from 1 to 6,
n is a number from 1 to 3,
o is a number from 1 to 12, and
p is a number from 1 to 3.

The objects of the invention are further achieved by providing a light-sensitive reproduction material suitable for use in the production of planographic printing plates for waterless printing, which comprises a support and a light-sensitive layer containing a 1,2-naphthoquinone diazide, wherein the 1,2-naphthoquinone diazide is a compound corresponding to the general formula I $$(R_FW)_p—Ar(—OD)_n \quad \text{(I)}$$
$$\overset{R^1}{|}$$

wherein
Ar denotes a mononuclear to trinuclear aromatic radical,
D is a 1,2-naphthoquinone-2-diazide-4-sulfonyl radical or a 1,2-naphthoquinone-2-diazide-5-sulfonyl radical,
$R_F$ is a perfluoroalkyl radical having from 5 to 15 carbon atoms,
W is a single bond or is selected from the group consisting of

```
—(CH₂)ₘCOO—
—(CH₂)ₘOOC—CHR²—O—
—(CH₂)ₘO—CₒH₂ₒ—COO—
—(CH₂)ₘOOC—
—(CH₂)ₘOOC—CₒH₂ₒ—COO—
—(CH₂)ₘSO₂NH—
—(CH₂)ₘOOC—CH=CH—COO—
—C₆H₄SO₂NH—
—(CH₂)ₘCO—
—(CH₂)ₘCONH—
—(CH₂)ₘSO₃—
—(CH₂)ₘOOC—CₒH₂ₒ—CONH—
—C₆H₄SO₃—
—(CH₂)ₘOOC—CH=CH—CONH,
```

$R^1$ is selected from the group consisting of hydrogen, halogen, an alkyl or alkoxy group having from 1 to 5 carbon atoms, acetyl and propionyl,
$R^2$ is an alkyl group having from 1 to 12 carbon atoms,
m is 0 or a number from 1 to 6,
n is a number from 1 to 3,
o is a number from 1 to 12, and
p is a number from 1 to 3.

DETAILED DESCRIPTION OF THE PREFERRED EMBODIMENTS

According to the invention, novel perfluoroalkyl-group containing 1,2-naphthoquinone-2-diazide sulfonic acid esters are provided, which correspond to the foregoing formula I.

The invention also provides a light-sensitive reproduction material for use in the production of planographic printing plates for waterless printing, which comprises a support and a light-sensitive layer containing a 1,2-naphthoquinone diazide, the material being characterized in that the 1,2-naphthoquinone diazide is a compound corresponding to the foregoing formula I.

In the compounds according to this invention, the perfluoroalkyl groups $R_F$ may be saturated or unsaturated, branched or unbranched. They are preferably unbranched and have up to two double bonds in the molecular radical.

The group Ar can comprise a radical derived from benzene, naphthalene, anthracene, or phenanthrene. It can advantageously also comprise two benzene rings which are connected by a single bond or one of the groups —O—, —S—, —C$_r$H$_{2r}$—, r being from 1 to 10, —CO—, or —SO₂—. In general compounds in which Ar does not contain an annellated benzene rings are preferred. In the particularly preferred compounds, Ar is a benzophenone radical.

Of the fluorinated radicals, preferred are those in which W is one of the groups —(CH₂)ₘCOO—, —(CH₂)ₘOOC— CH=CH—COO—, —C₆H₄SO₃—, —(CH₂)ₘCO—, and —(CH₂)ₘOOC—.

In addition, compounds are preferred, in which p=1 or 2 (in particular p=1), n=2 or 3, m=0, 1, or 2 and o is a number from 1 to 4; $R^2$ preferably has not more than 3 carbon atoms.

Analogously to known compounds, the compounds according to the present invention can be prepared as follows:

(1) By stepwise or simultaneously introducing at least one perfluoroalkyl group and at least one naphthoquinone diazide sulfonyl group into an aromatic polyhydroxy compound. In the process, the polyhydroxy compound $R^1$-Ar(OH)$_{n=p}$ is reacted with a compound $R_F$QCl, where Q is a W group lacking a single oxygen (i.e., W is Q—O), $R_F$WX and a 1,2-naphthoquinone-2-diazide-4-sulfonyl halide or a 1,2-naphthoquinone-2-diazide-5-sulfonyl halide. X denotes a halogen atom, the preferred halogen generally being chlorine.

(2) By reacting phenols $R^1$-Ar(OH)$_n$ with fluoroalkyl halides or fluoroalkanoic acid halides $R_F$QX under conditions of a Friedel-Crafts reaction. Q can denote, for example —(CH₂)ₘO—CₒH₂ₒ—CO—, —(CH₂)ₘOOC—CH=CH—CO—, or —(CH₂)ₘCO— or can be a single bond. These compounds can also be obtained from corresponding compounds $R^1$-Ar(WR$_F$) (OH)$_{n-1}$ by a Fries rearrangement. Thereafter, the OH groups are reacted with a naphthoquinone diazide sulfonic acid chloride.

(3) By esterifying aromatic hydroxycarboxylic acids with perfluoroalkyl alcohols and reacting the hydroxyl groups with a naphthoquinone diazide sulfonic acid chloride. Hydroxynaphthoic acids are also suitable for use as aromatic hydroxycarboxylic acids.

(4) By reacting aminophenols of the formula $R^1$-Ar(NH₂) (OH)$_n$ with an acyl halide $R_F$QX to form the corresponding acylamino compound and then esterifying the OH groups with a naphthoquinone diazide sulfonic acid halide.

The fluorinated naphthoquinone diazides according to the present invention are useful in light-sensitive reproduction materials which customarily comprise a support and a light-sensitive layer.

The light-sensitive layer can be comprised solely of the novel naphthoquinone diazides. Preferably, however, it also contains other customary components, particularly a polymeric binder. The most preferred binders are polymers which are insoluble in water and soluble in aqueous-alkaline solutions.

Suitable binders include natural resins, such as shellac and colophony, and synthetic polymers, such as copolymers of styrene and maleic anhydride or copolymers of acrylic or methacrylic acid, particularly with acrylic or methacrylic esters. The preferred binders are the novolaks which have proved suitable for use in positive plates, in particular, the relatively highly condensed resins from substituted phenols, for example cresols, and formaldehyde. Polyvinyl phenols can also advantageously be used.

Binders comprising units with perfluoroalkyl side groups have proved to be particularly advantageous for combining with the compounds according to the present invention.

Binders of that kind preferably include those which have been described for the first time in copending U.S. Patent Applications, Ser. No. 742,394 and Ser. No. 742,393 entitled "Perfluoroalkyl Group-Containing Copolymers (or Polymers, respectively) and Reproduction Layers Produced Therefrom" (corresponding to German Patent Applications Nos. P 34 21 526.3 and P 34 21 448.8) These are, among others, copolymers of perfluoroalkyl acrylates and acrylates having at least one phenolic OH group or co-condensates formed of a phenolic component containing perfluoroalkyl groups and a condensible compound.

The light-sensitive layers of the reproduction materials according to the present invention generally contain from 5 to 65% by weight, preferably from 10 to 50% by weight, of naphthoquinone diazides. The polymeric binders are usually contained in the layer in an amount ranging from 35 to 90% by weight, preferably from 50 to 85% by weight, in each case based on the content of non-volatile constituents.

In addition to alkali-soluble resins, a great number of other resins can additionally be used, preferably epoxides and vinyl polymers, such as polyvinyl acetates, polyacrylates, polyvinyl acetals, polyvinyl ethers, polyvinyl pyrrolidones, and the copolymers formed from the monomers on which these resins are based. The most favorable proportion of such resins depends on application related requirements and on their influence on development conditions and generally does not exceed 20% by weight of the alkali-soluble resin. To meet special requirements, such as flexibility, adhesion, gloss, coloration and color change, etc., the light-sensitive layer can additionally contain minor amounts of substances, such as polyglycols, cellulose derivatives such as ethyl cellulose, wetting agents, dyes, adhesion promoters, and finely divided pigments and, if required, U.V. absorbers.

For coating a suitable support, the compositions are usually dissolved in a solvent. The selection of solvents depends on the intended coating process, the layer thickness, and the drying conditions. Suitable solvents for the composition of the invention include ketones, such as methyl ethyl ketone; chlorinated hydrocarbons, such as trichloroethylene and 1,1,1-trichloroethane; alcohols, such as n-propanol; ethers, such as tetrahydrofuran; alcohol ethers, such as ethylene glycol monoethyl ether or 1-methoxy-propan-2-ol; and esters, such as butyl acetate. It is also possible to use mixtures which, for special purposes, may additionally contain solvents such as acetonitrile, dioxane, or dimethyl formamide. In principle, any solvents are suitable which do not irreversibly react with the layer components. Partial ethers of glycols are particularly preferred.

In most cases, metals are used as the support materials. For offset-printing plates, the following support materials can be used: mill-finished, mechanically or electrochemically roughened and optionally anodically oxidized aluminum which is optionally also chemically pretreated, for example, using polyvinyl phosphonic acid, silicates, phosphates, hexafluorozirconates or a hydrolyzed tetraethyl orthosilicate. Other suitable metals include steel and chromium. Other than in normal planographic printing plates, it is not necessary for the support surface to be hydrophilic and, therefore, copper, brass and other oleophilic metals can also advantageously serve as support surfaces. It is also possible to use plastic films, such as polyester, polycarbonate, polyimide or cellulose acetate films, the surfaces of which are optionally pretreated to increase their capability of being wetted by printing ink. In order to adapt the support to the wetting behavior of the desired printing ink, an intermediate layer which does not dissolve in the developer can be applied to the support.

In the printing plates produced from the reproduction material of the present invention, the support material serves as the ink-receptive material, contrary to the customary printing plates. The light-sensitive layer which remains on the support after exposure and development serves as the image background and has an ink repellent action in the dry state. For printing, the usual printing inks based on oils and also special hydrophilic printing inks, such as the commercially available inks developed for waterless offset printing and reversed offset printing can be employed. Since most of the customary support surfaces are highly hydrophilic, for example, roughened or anodically oxidized aluminum, it is advantageous to use hydrophilic printing inks.

The support material is coated in the usual manner by spin-coating, spraying, immersion, roller application, application by means of slot dies, doctor blades or flow-coaters. Light sources which are customary in the art are used for exposure. It is also possible to produce images by irradiation with electrons or lasers.

For development, aqueous-alkaline solutions of graded alkalinity, preferably having a pH in the range from 10 to 14, are used, which can also contain minor amounts of organic solvents or wetting agents. These developer solutions remove those areas of the light-sensitive layer which have been struck by light and thus produce a positive image of the original on the plate. Due to the reversing effect of an offset plate for waterless printing, a negative of the original is obtained in the printing process.

The following illustrative examples explain preferred embodiments of the invention. First, general procedures for the preparation of the compounds according to the invention are given. These are followed by eight examples of synthesis and thirteen examples of use. In the examples, quantitative ratios and percentages refer to weight, unless otherwise indicated.

Procedures for the reaction of polyhydroxyphenols with chlorides of fluorinated organic acids and 1,2-naphthoquinone-2-diazide sulfonic acid chlorides:

0.1 (n-1) mole of 1,2-naphthoquinone-2-diazide sulfonic acid chloride, 0.1 mole of n-hydric phenol, and 0.1 mole of a fluorinated acid chloride were dissolved in 350 ml of dioxane. Within a period of 1 hour, 0.11 mole of triethylamine, dissolved in 80 ml of dioxane, were added dropwise with stirring and ice cooling (maximum temperature 25° C.). Thereafter, the reaction mixture was stirred for another 4 hours at room temperature, the solution was separated by filtration from the precipitated triethylamine hydrochloride and then stirred into about 4 liters of ice water which was maintained at a pH of about 3 by means of hydrochloric acid. The precipitate was filtered off, washed with water and dried overnight in a circulating air drying cabinet at 30° C. The structure of the compounds obtained was, in each case, confirmed by nuclear magnetic resonance (NMR) spectra for $^1H$ and $^{19}F$.

EXAMPLES 1 TO 6

Reactions of 1 mole of 2,3,4-trihydroxy-benzophenone with 2 moles of 1,2-naphthoquinone-2-diazide sulfonic acid chloride and 1 mole of a fluorinated acid chloride.

TABLE I

| Example of Synthesis No. | D—Cl | $R_fQCl$ | Molecular Formula | Products Yield % | % F calc. | % F found | % N calc. | % N found |
|---|---|---|---|---|---|---|---|---|
| 1 | $D_5$—Cl | $CF_3(CF_2)_{5.5}CH_2COCl$ | $C_{41.5}F_{14}H_{19}O_{11}N_4S_2$ | 92 | 24.3 | 24.2 | 5.2 | 4.5 |
| 2 | $D_5$—Cl | $CF_3(CF_2)_7CH_2COCl$ | $C_{43}F_{17}H_{19}O_{11}N_4S_2$ | 90 | 28.0 | 29.9 | 4.9 | 3.7 |
| 3 | $D_4$—Cl | " | " | 98 | 24.3 | 25.2 | 5.2 | 4.8 |
| 4 | $D_5$—Cl | $CF_3(CF_2)_{6.5}CH_2CH_2OOC-CH \\ \phantom{xxxxxxxxxxxxxx} \| \\ \phantom{xxxxxxxxxxx} ClCO-CH$ | $C_{46.5}F_{16}H_{23}O_{13}N_4S_2$ | 87 | 25.1 | 28.7 | 4.6 | 3.7 |
| 5 | $D_5$—Cl | $CF_3(CF_2)_6COCl$ | $C_{41}F_{15}H_{17}O_{11}N_4S_2$ | 60 | 26.1 | 29.5 | 5.1 | 4.2 |
| 6 | $D_5$—Cl | $C_8F_{17}$—m-phenylene-$SO_2Cl$ | $C_{47}H_{21}F_{17}O_{12}N_4S_3$ | 93 | 25.8 | 26.9 | 4.5 | 4.2 |

$D_5$ = 1,2-naphthoquinone-2-diazide-5-sulfonyl
$D_4$ = 1,2-naphthoquinone-2-diazide-4-sulfonyl
Q = W minus an oxygen (O) atom

EXAMPLE 7

(A) Preparation of 1,3-dihydroxy-4-perfluorooctanoylbenzene 11 g (0.1 mole) of resorcinol were refluxed in 150 ml of 1,2-dichloroethane for 10 minutes. The solution was then cooled to 0° C. with stirring in an ice bath and 32 g of anhydrous aluminum chloride was added in one portion. In the course of 2 hours, 43.2 g (0.1 mole) of perfluorooctanoic acid chloride were added dropwise at a temperature of 0° to 5° C. The ice bath was then removed and the reaction mixture was stirred for another 4 hours at room temperature. Thereafter the mixture was poured on ice and repeatedly extracted with methylene chloride; the combined extracts were washed with water, dried over magnesium sulfate and then completely dried in a rotary evaporator. Yield: 45.9 g=91% of the theoretical.
Molecular formula: $C_{14}F_{15}H_5O_3$ % F: calculated 56.3, found: 56.3.

(B) Reaction of 1,3-dihydroxy-4-perfluorooctanoylbenzene with 1,2-naphthoquinone-2-diazide sulfonic acid chloride 25.3 g of the reaction product obtained in A and 26.8 g of 1,2-naphthoquinone-2-diazide-5-sulfonic acid chloride were dissolved in about 200 ml of acetone, and 11 g of triethylamine dissolved in 50 ml of acetone were added dropwise to the solution within 30 minutes, while reaction temperature was kept below 30° C. by ice cooling. The reaction mixture was stirred for another 3 hours at room temperature, then the solution was separated by filtration from the precipitated triethylamine hydrochloride and introduced dropwise into 3 to 4 liters of acidified ice water; in the process, a fine precipitate developed. After standing overnight, the liquid phase was decanted and the sediment was centrifuged, washed with water and dried in a circulating air drying cabinet at 30° C.
Yield: 30.3 g=62.5% of the theoretical.
Molecular formula: $C_{34}F_{15}H_{13}O_9N_4S_2$
% F: calculated: 29.4, found: 28.6.
% N: Calculated: 5.8, found: 5.6.

EXAMPLE 8

(A) Preparation of gallic acid perfluorooctyl ethyl ester 2.8 g of gallic acid (0.0165 mole), 14 g of perfluorooctylethanol (0.03 mole) and 2 g of an acidic ion exchanger (Amberlyst ® 15) were heated for 6 hours at 110° to 130° C. The excess alcohol was distilled off in vacuo and the content of the flask was then dissolved in 30 g of diisopropylether and 5 g of ethyl acetate. After filtering off the ion exchanger, the reaction product was slowly precipitated by adding gasoline.
Yield: 6 g of an ocher-colored powder=59% of the theoretical.
Melting point: 170° to 172° C.
The $^1H$ and $^{19}F$-NMR-spectra corresponded to the assumed structure.

(B) Reaction of the gallic acid perfluorooctyl ethyl ester with 1,2-naphthoquinone-2-diazide sulfonic acid chloride 5 g of the gallic acid ester obtained under A were reacted, in the manner described in Example 7B, with 8.75 g of naphthoquinone diazide sulfonic acid chloride by adding dropwise 4 g of triethylamine in 100 ml of dioxane.
Yield: 10.5 g=99% of the theoretical.
% F: calculated: 24.6, found: 23.3.
% N: calculated: 6.4, found: 6.4.

EXAMPLES 9–20

Coating solutions were applied to electrochemically roughened aluminum plates, slightly dried with warm air and then post-dried for 1 minute in a drying oven at 100° C. The resulting plates were then exposed for 100 seconds to the light of a 5 kW metal halide lamp arranged at a distance of 100 cm from the vacuum copying frame, through a negative original of a step wedge and then developed with a solution composed of:
7 g of sodium metasilicate×9 H$_2$O,
0.05 g of the sodium salt of a fatty alcohol polyglycol ether-sulfuric acid ester, and
0.01 g of a commercial antifoaming agent in
92.9 g of water.

Following rinsing with water and brief drying at 100° C., the plates were inked with a commercial printing ink for waterless offset printing, by means of a roller.

In the following Table II, the amounts of binder and naphthoquinone diazide compound according to one of the Examples 1 to 8, which were contained in the coating solutions are indicated in parts by weight. Each of the coating solutions additionally contained 0.02 part by weight of 4-phenylazo-diphenylamine which served to die the layer as well as 19 parts by weight of butanone and 5 parts by weight of 1-methoxy-propan-2-ol as a solvent.

As the results of the evaluation, the layer quality of the dry light-sensitive layer prior to exposure and the number of continuous tone wedge steps after development and inking are given. A 13-step continuous tone step wedge with density increments of 0.15 was used and, in each case, the numbers of the first clean and of the last solid steps are indicated.

Moreover, visual assessment of ink repellency in the non-image areas (layer) and ink receptivity in the image areas (support) is indicated. These properties and the developability of the layers were also judged by visual examination of the steps of halftone step wedges. The halftone step wedges used have 12 steps with surface coverages from 5% (step 12) to 95% (step 1). In each case, the number of the step is indicated up to which the nonimage areas repelled ink, and also the number of the step in which the image areas accepted ink for the first time. These data are given for a screen of 60 lines/cm and a screen of 120 lines/cm. Optimum development and differentiation between ink-repellent layer areas and ink-receptive background areas was attained, if step 1 (5% screen dots) already showed a good ink receptivity and step 12 (95% of screen dots) was still sufficiently ink-repellent in the non-image areas to prevent inking of the full surface.

TABLE II

| Example of Use | 1 | 2 | 3 | 4 | 5 | 6 | 7 | 8 | 9 | 10 | 11 | 12 |
|---|---|---|---|---|---|---|---|---|---|---|---|---|
| Binder* | quantity in parts by weight | | | | | | | | | | | |
| B1 | | | | | | | | | | | | 0.5 |
| B2 | 0.5 | 0.5 | 0.5 | 0.5 | 0.5 | 0.5 | 0.5 | 0.5 | | | | |
| B3 | | | | | | | | | 0.8 | 0.8 | | |
| B4 | 0.5 | 0.5 | 0.5 | 0.5 | 0.5 | 0.5 | 0.5 | 0.5 | | | | 0.5 |
| B5 | | | | | | | | | | | 1.0 | |
| Crosslinking Agent** | | | | | | | | | | | | 0.5 |
| Compound of Example of Synthesis | | | | | | | | | | | | |
| 1 | 1.0 | | | | | | | | 1.2 | | | |
| 2 | | 1.0 | | | | | | | | | | |
| 3 | | | 1.0 | | | | | | | | | |
| 4 | | | | 1.0 | | | | | | 1.4 | | 1.0 |
| 5 | | | | | 1.0 | | | | | | | |
| 6 | | | | | | 1.0 | | | | | | |
| 7 | | | | | | | 1.0 | | | | 1.0 | |
| 8 | | | | | | | | 1.0 | | | | |
| Layer*** Quality | vg | vg | vg | g | g | m | vg | vg | m | m | p | g |
| Developing Time (s) | 60 | 60 | 60 | 60 | 30 | 60 | 60 | 60 | 600 | 150 | 120 | 60 |
| Cont. Tone Step Wedge clean from/ solid to | 9/7 | 8/6 | 8/6 | 8/6 | —/13 | 8/6 | 8/6 | 10/6 | 9/6 | 5/5 | 8/3 | 8/7 |
| Ink Repellency | g | g | g | g | p | m | g | m | g | g | g | g |
| Ink Receptivity | g | g | g | g | g | g | g | g | g | g | m | g |
| Halftone Step Wedge non-image areas repellent up to | | | | | | | | | | | | |
| 60 lines/cm screen | 1 | 1 | 2 | 1 | 4 | 2 | 1 | 2 | 1 | 1 | 1 | 1 |
| 120 lines/cm screen | 3 | 2 | 3 | 2 | 5 | 3 | 2 | 3 | 3 | 2 | 5 | 2 |
| image areas ink-receptive from | | | | | | | | | | | | |
| 60 lines/cm screen | 12 | 12 | 12 | 12 | 12 | 12 | 12 | 12 | 12 | 12 | 12 | 12 |
| 120 lines/cm screen | 12 | 12 | 12 | 12 | 12 | 11 | 12 | 12 | 11 | 12 | 12 | 12 |

Binder* The binders B1 to B5 used are described below
Crosslinking agent
**hexamethoxymethylmelamine
***Ink repellency and ink receptivity
vg = very good
g = good
m = moderate
p = poor Binder (*): The binders B1 to B5 used are described below Crosslinking agent (): hexamethoxymethylmelamine (*): Ink repellency and ink receptivity vg=very good g=good m=moderate p=poor

PREPARATION OF B1

36 parts by weight of a polyvinyl phenol having an average molecular weight of 4,500 were reacted with 30 parts by weight of maleic acid monochloride-monoperfluoroalkyl ethyl ester in acetone, in the presence of the equivalent quantity of triethylamine. The perfluoroalkyl group had the molecular formula $C_{7.5}F_{16}$.

Melting range: 180° to 200° C.

PREPARATION OF B2

The procedure of B1 was repeated. However, the polyvinyl phenol used was replaced by the same quantity of a polyvinyl phenol having an average molecular weight of 10,000.

Melting range: 170° to 190° C.

PREPARATION OF B3

24.6 parts by weight of a cresol-formaldehyde novolak having a melting range from 105° to 120° C., according to DIN 53181 were reacted with 33.2 parts by weight of the maleic acid derivative indicated in B1, in acetone and in the presence of the equivalent quantity of triethylamine. Melting range: 100° to 120° C.

PREPARATION OF B4

The procedure of B3 was repeated. However, 16.6 parts by weight of the maleic acid derivative were used. Melting range: 130° to 150° C.

PREPARATION OF B5

60 parts by weight of the mixed ether of ethylene glycol, acrylic acid and o-hydroxybenzoic acid were copolymerized with 40 parts by weight of $C_7F_{15}CH_2CH_2OCO-CH=CH_2$.

EXAMPLE 21

A printing plate composed of a support and a light sensitive layer as indicated in Example 20 was exposed as described in that example and then heated for 4 minutes to 120° C., without developing, and thereafter was again exposed for 100 seconds without using an original. Upon developing with the developer specified in Examples 9–20, the layer areas which had not been exposed imagewise were detached within 3 minutes, so that a positive image of the original was obtained when the plate was inked.

The continuous tone step wedge was clean up to step 6 and solid from step 7 onwards.

In the 60 lines/cm screen halftone step wedge, the nonimage areas in step 12 were still ink-repellent and the image areas in step 1 were already ink-receptive.

In the 120 lines/cm screen halftone step wedge, the nonimage areas in step 12 were also still ink-repellent and the image areas in step 2 were already ink-receptive.

The foregoing description of preferred embodiments has been set forth merely to illustrate the invention and is not intended to be limiting. Since modifications of the described embodiments incorporating the spirit and substance of the invention may occur to persons skilled in the art, the scope of the invention should be limited solely with respect to the appended claims and equivalents.

What is claimed is:

1. A perfluoroalkyl group-containing 1,2-naphthoquinone-2-diazide sulfonic acid ester corresponding to the formula (I).

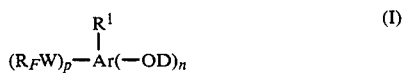
(I)

wherein
Ar denotes a mononuclear to trinuclear aromatic radical
D is a 1,2-naphthoquinone-2-diazide-4-sulfonyl radical or a 1,2-naphthoquinone-2-diazide-5-sulfonyl radical,
$R_F$ is a perfluoroalkyl radical having from 5 to 15 carbon atoms,
W is a single bond or is selected from the group consisting of

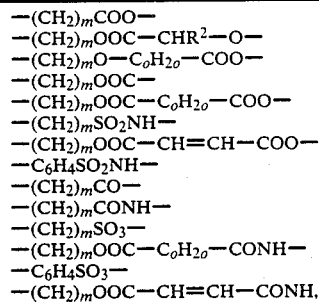

wherein $R_F$ is bonded to $-(CH_2)_m$ or $-C_6H_4$,
$R^1$ is selected from the group consisting of hydrogen, halogen, an alkyl or alkoxy group having from 1 to 5 carbon atoms, acetyl and propionyl,
$R^2$ is an alkyl group having from 1 to 12 carbon atoms,
m is 0 or a number from 1 to 6,
n is a number from 1 to 3,
o is a number from 1 to 12, and
p is a number from 1 to 3.

2. A naphthoquinone diazide sulfonic acid ester as claimed in claim 1, wherein Ar is a benzophenone radical.

3. A naphthoquinone diazide sulfonic acid ester as claimed in Claim 2, wherein the benzophenone is 2,3,4-trihydroxy-benzophenone.

4. A light-sensitive reproduction material for use in the production of planograph printing plates for waterless printing, comprising a support and a light-sensitive layer containing an admixture of (a) from about 35 to about 90% by weight of a polymeric binder and (b) from about 5 to about 65% by weight of a 1,2-naphthoquinone diazide, wherein the 1,2-naphthoquinone diazide is a compound corresponding to the formula (I).

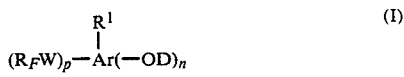
(I)

wherein
Ar denotes a mononuclear to trinuclear aromatic radical
D is a 1,2-naphthoquinone-2-diazide-4-sulfonyl radical or a 1,2-naphthoquinone-2-diazide-5-sulfonyl radical,
$R_F$ is a perfluoroalkyl radical having from 5 to 15 carbon atoms,
W is a single bond or is selected from the group consisting of

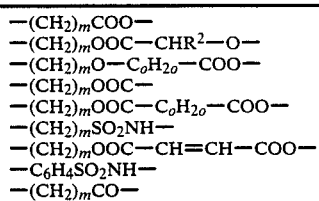

-continued

—(CH$_2$)$_m$CONH—
—(CH$_2$)$_m$SO$_3$—
—(CH$_2$)$_m$OOC—C$_o$H$_{2o}$—CONH—
—C$_6$H$_4$SO$_3$—
—(CH$_2$)$_m$OOC—CH=CH—CONH, wherein R$_F$ is bonded to —(CH$_2$)$_m$ or —C$_6$H$_4$,
R$^1$ is selected from the group consisting of hydrogen, halogen, an alkyl or alkoxy group having from 1 to 5 carbon atoms, acetyl and propionyl,
R$^2$ is an alkyl group having from 1 to 12 carbon atoms,
m is 0 or a number from 1 to 6,
n is a number from 1 to 3,
o is a number from 1 to 12, and
p is a number from 1 to 3.

5. A light-sensitive reproduction material as claimed in claim 4, wherein said polymeric binder is insoluble in water and soluble in aqueous alkaline solutions.

6. A light-sensitive reproduction material as claimed in claim 5, wherein the binder comprises units which each contain at least one perfluoroalkyl radical having from 5 to 15 carbon atoms.

* * * * *